United States Patent
Ogawa et al.

(10) Patent No.: US 6,611,317 B1
(45) Date of Patent: Aug. 26, 2003

(54) EXPOSURE APPARATUS, SEMICONDUCTOR DEVICE, AND PHOTOMASK

(75) Inventors: Tohru Ogawa, Kanagawa (JP); Hideo Hosono, Kanagawa (JP); Shinya Kikugawa, Kanagawa (JP); Yoshiaki Ikuta, Kanagawa (JP); Akio Masui, Tokyo (JP); Noriaki Shimodaira, Kanagawa (JP); Shuhei Yoshizawa, Tokyo (JP)

(73) Assignees: Asahi Glass Company, Limited, Tokyo (JP); Semiconductor Leading Edge Technologies, Inc., Kanagawa (JP)

( * ) Notice: Subject to any disclaimer, the term of this patent is extended or adjusted under 35 U.S.C. 154(b) by 0 days.

(21) Appl. No.: 09/701,180

(22) PCT Filed: Mar. 27, 2000

(86) PCT No.: PCT/JP00/01868
§ 371 (c)(1),
(2), (4) Date: Feb. 16, 2001

(87) PCT Pub. No.: WO00/59013
PCT Pub. Date: Oct. 5, 2000

(30) Foreign Application Priority Data

Mar. 25, 1999 (JP) .......................................... 11-082067

(51) Int. Cl.⁷ ........................ G03B 27/72; G03B 27/54; G03B 27/52; G03F 9/00
(52) U.S. Cl. .............................. 355/71; 355/30; 355/67; 430/5
(58) Field of Search ...................... 355/30, 53, 67–71; 359/350; 65/30.1; 501/53, 54

(56) References Cited

U.S. PATENT DOCUMENTS

| | | | |
|---|---|---|---|
| 5,326,729 A | 7/1994 | Yaba et al. | 501/54 |
| 5,679,125 A * | 10/1997 | Hiraiwa et al. | 65/397 |
| 5,983,673 A | 11/1999 | Urano et al. | 65/30.1 |
| 6,242,136 B1 * | 6/2001 | Moore et al. | 430/5 |
| 6,411,368 B1 * | 6/2002 | Matsumoto et al. | 355/67 |

FOREIGN PATENT DOCUMENTS

| | | |
|---|---|---|
| EP | 0 720 969 | 7/1996 |
| EP | 0 964 307 | 12/1999 |
| EP | 1 031 877 | 8/2000 |
| EP | 1 043 282 | 10/2000 |
| JP | 5-178632 | 7/1993 |
| JP | 10-316445 | 12/1998 |
| WO | WO 97/16382 | 5/1997 |
| WO | WO 98/43135 | 10/1998 |

* cited by examiner

*Primary Examiner*—Henry Hung Nguyen

(57) ABSTRACT

An exposure apparatus, wherein at least one of optical members constituting an exposure light source system, an illuminating optical system, a photomask and a projection optical system, is made of a synthetic quartz glass for an optical member, which has an absorption coefficient of 0.70 $cm^{-1}$ or less at a wavelength of 157 nm and an infrared absorption peak attributable to SiOH stretching vibration at about 3640 $cm^{-1}$.

4 Claims, 2 Drawing Sheets

EXPOSURE APPARATUS, SEMICONDUCTOR DEVICE, AND PHOTOMASK

TECHNICAL FIELD

The present invention relates to an exposure apparatus, a semiconductor device and a photomask, particularly to an exposure apparatus for producing a semiconductor device comprising an integrated circuit having a fine pattern with a line width of 100 nm or less using a fluorine laser as an exposure light source, a semiconductor device obtainable by such an exposure apparatus, and a photomask.

BACKGROUND ART

Heretofore, in a photolithographic technology, an exposure apparatus has been widely utilized which transfers a fine circuit pattern on a wafer to produce a semiconductor device comprising an integrated circuit. Along with high integration and high functionality of an integrated circuit, the exposure apparatus is required to form an image of a circuit pattern with high resolution on a wafer with a deep focal depth to have a fine circuit pattern drawn with a narrower line width, and shortening of the wavelength of the exposure light source is being advanced. The exposure light source has been advanced from conventional g-line (wavelength: 436 nm) or i-line (wavelength: 365 nm), and now, a KrF excimer laser (wavelength: 248 nm) or an ArF excimer laser (wavelength: 193 nm) is being used. Further, as a light source of next generation which is required to draw a further finer line with a width of 100 nm or less, a fluorine laser (wavelength: 157 nm) is expected to be a prospective candidate.

In an optical system of an exposure apparatus using a KrF excimer laser or an ArF excimer laser as a light source, a synthetic quartz glass is employed, since it is transparent over a wide wavelength range from a near infrared region to a vacuum ultraviolet region, and it is excellent in various properties such that the thermal expansion coefficient is very small so that it is excellent in dimensional stability, and it has high purity. However, a synthetic quartz glass having a large OH group content, which is used for a KrF excimer laser or an ArF excimer laser, has a low transmittance in a region of wavelengths of not longer than 165 nm, and as such, it is not useful for a fluorine laser which is expected to be a light source of next generation.

Further, with a synthetic quartz glass having the OH group content reduced in order to improve the transmittance in a region of wavelengths of not longer than 165 nm, the transmittance sharply decreases as the wavelength of the transmitted light becomes shorter than about 170 nm.

Accordingly, in a case where a synthetic quartz glass is to be used as an optical member in an exposure apparatus employing a fluorine laser as a light source, it will be an important subject to improve the transmittance.

Further, the optical system of an exposure apparatus is constituted by a combination of many optical members such as lenses and prisms. Accordingly, an improvement in transmittance of each individual optical member will bring about a large improvement in transmittance when integrated as an entire optical system.

However, a process for efficiently and conveniently producing a synthetic quartz glass which has an improved transmittance in a region of wavelengths of not longer than 165 nm which is the wavelength region of fluorine laser and which can be applied to an optical member of an exposure apparatus using a fluorine laser as a light source, has not yet been proposed, and has been a serious objective with a view to developing an exposure apparatus of next generation.

The present invention has an object to provide an exposure apparatus for producing a semiconductor device comprising an integrated circuit having a fine pattern with a line width of 100 nm or less using a fluorine laser beam as an exposure light source, and a semiconductor device obtainable by such an exposure apparatus.

The present invention also has an object to provide a photomask which is useful for forming a fine pattern with a line width of 100 nm or less on a wafer by means of an exposure apparatus using a fluorine laser as a light source.

DISCLOSURE OF THE INVENTION

The present invention provides an exposure apparatus employing a fluorine laser (hereinafter referred to as "$F_2$ laser") as a light source, wherein at least one of optical members constituting an exposure light source system, an illuminating optical system, a photomask and a projection optical system, is made of a synthetic quartz glass for an optical member, and said synthetic quartz glass for an optical member has an absorption coefficient of 0.70 cm$^{-1}$ or less at a wavelength of 157 nm.

Further, the present invention provides an exposure apparatus, wherein at least one of optical members constituting an exposure light source system employing $F_2$ laser as a light source, an illuminating optical system, a photomask and a projection optical system, is made of a synthetic quartz glass for an optical member, and said synthetic quartz glass for an optical member is one obtained by a process comprising a step of irradiating a synthetic quartz glass having an OH content of 50 ppm or lower and a hydrogen molecule content of 1×10$^{17}$ molecules/cm$^3$ or higher, with vacuum ultraviolet light having a wavelength of 180 nm or shorter, to improve the transmittance in a region of wavelengths of not longer than 165 nm.

The present inventors have found that in an exposure apparatus using $F_2$ laser having a wavelength of 157 nm as a light source, an optical member constituting each of an exposure light source system, an illuminating optical system, a photomask and a projection optical system constituting the exposure apparatus, is required to have a high transmittance of $F_2$ laser, and it is effective that the absorption coefficient at a wavelength of 157 nm is 0.70 cm$^{-1}$ or less. It is particularly preferred that the absorption coefficient at a wavelength of 157 nm is 0.30 cm$^{-1}$ or less.

Further, it has been found effective that the optical member has an infrared absorption peak attributable to SiOH stretching vibration at about 3640 cm$^{-1}$.

The present invention provides, as one of optical members, a photomask employing a synthetic quartz glass for an optical member, which has an absorption coefficient of 0.70 cm$^{-1}$ or less at a wavelength of 157 nm and an infrared absorption peak attributable to SiOH stretching vibration at about 3640 cm$^{-1}$.

Further, the present invention provides a photomask employing a synthetic quartz glass for an optical member obtained by a process comprising a step of irradiating a synthetic quartz glass having an OH content of 50 ppm or lower and a hydrogen molecule content of 1×10$^{17}$ molecules/cm$^3$ or higher, with vacuum ultraviolet light having a wavelength of 180 nm or shorter, to improve the transmittance in a region of wavelengths of not longer than 165 nm.

BEST MODE FOR CARRYING OUT THE INVENTION

Figure 1:
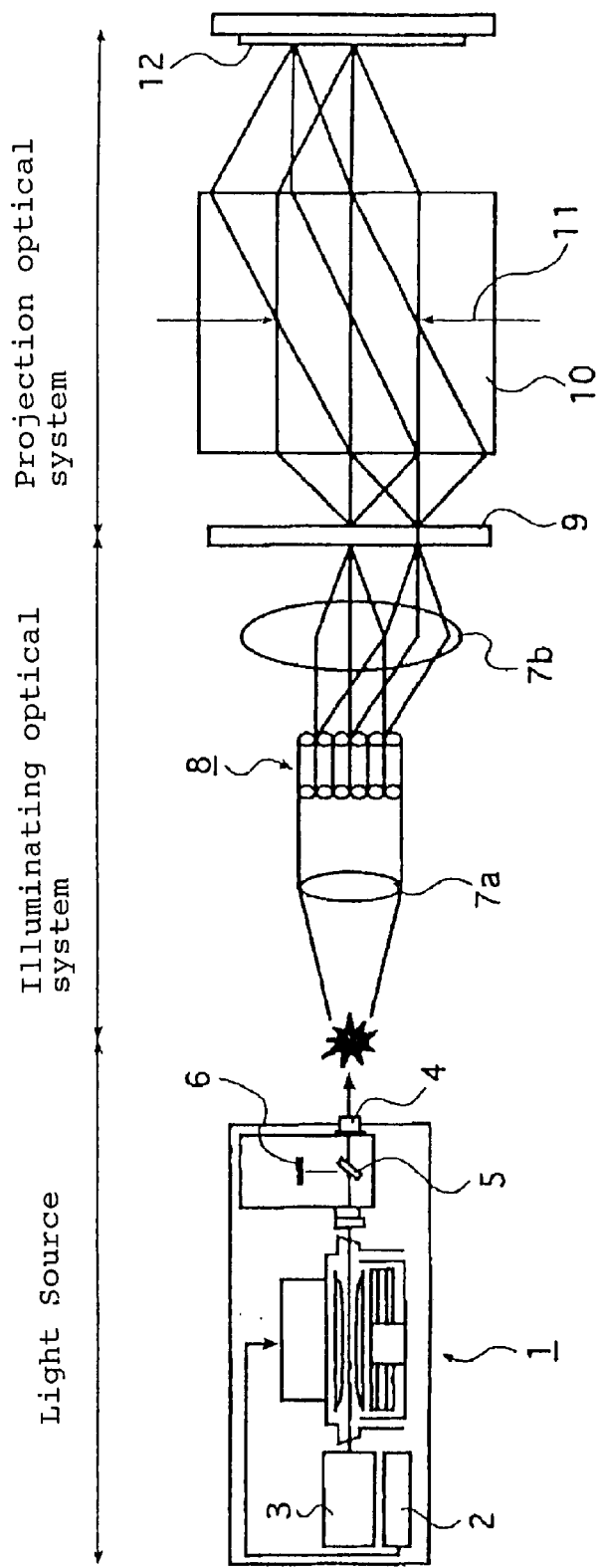
FIG. 1 is a schematic view illustrating an embodiment of the exposure apparatus of the present invention.
Figure 2:
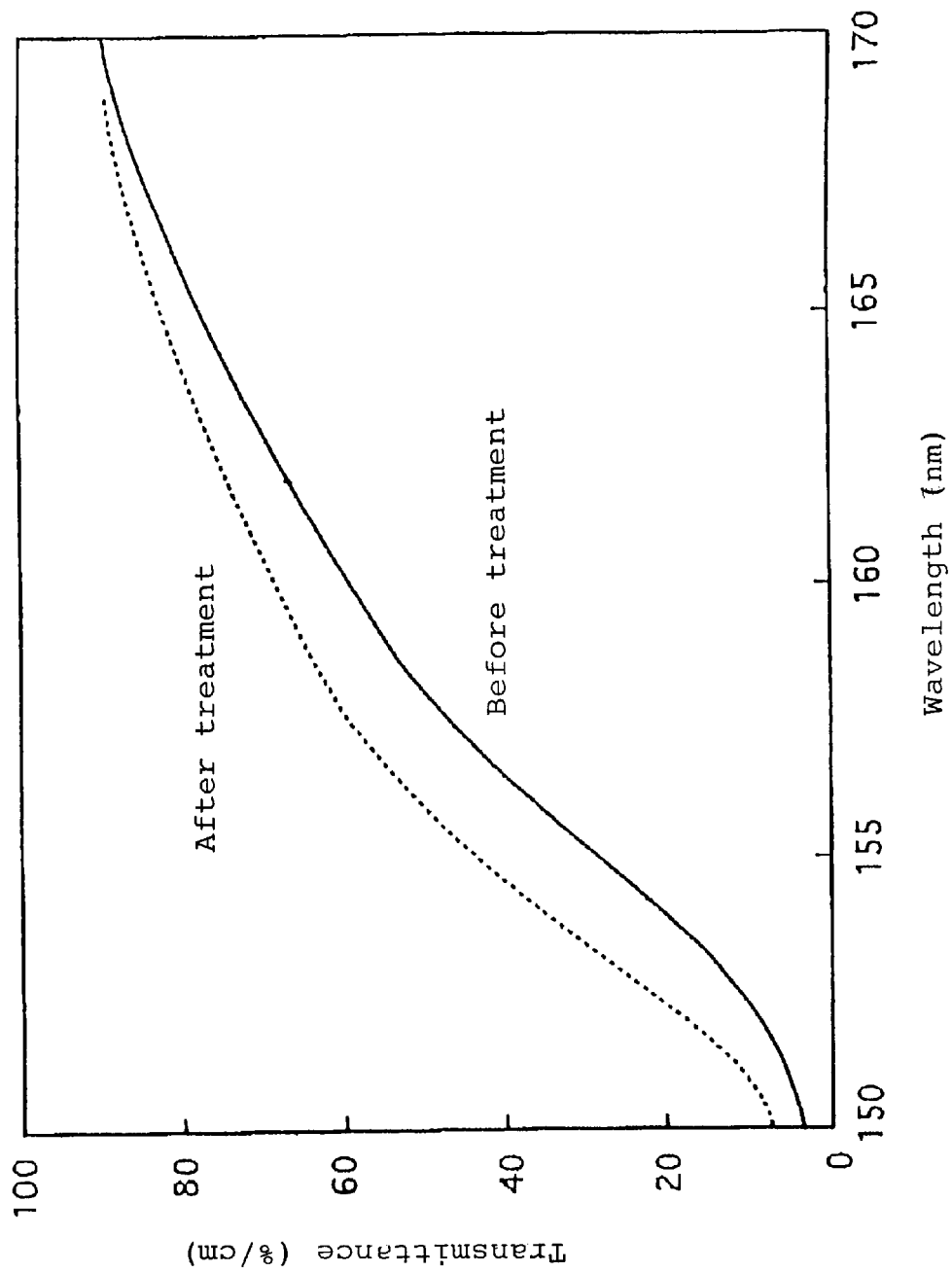
FIG. 2 is a graph showing the results of the spectral transmittance measurement before and after irradiation treatment in Preparation Example 3 of the present invention.

In the present invention, a photomask is one having a pattern corresponding to a circuit pattern to be formed on a wafer, formed on the surface of a transparent substrate, and it is used for a photolithographic exposure apparatus (such as a stepper, a scanner, etc.) and may be called also as a reticle. In the present invention, a photomask or reticle using a synthetic quartz glass for an optical member, is one having a transparent substrate made of a synthetic quartz glass for an optical member and having a pattern corresponding to a circuit pattern to be formed on a wafer, formed on the surface.

Further, the present inventors have found that in order to improve the transmittance at a wavelength of 165 nm or shorter of a synthetic quartz glass used as an optical member of an exposure apparatus using $F_2$ laser as a light source, it is effective to apply irradiation treatment with vacuum ultraviolet light having a wavelength of 180 nm or shorter to a synthetic quartz glass having the OH content and the hydrogen molecule content controlled.

Then, they have studied an influence of the OH group content and the hydrogen molecule content in a synthetic quartz glass before the irradiation treatment (hereinafter referred to as a "non-irradiated synthetic quartz glass") over the transmittance at a wavelength of 165 nm or shorter of the synthetic quartz glass after the irradiation treatment. As a result, it has been found that the OH group content in the non-irradiated synthetic quartz glass gives an influence over the light transmittance in the vacuum ultraviolet region, so that the light transmittance decreases as the OH group content is high, but at a level of 50 ppm or lower, the transmittance at a wavelength of 165 nm or shorter can be improved by irradiation with vacuum ultraviolet light, and especially, at a level of 30 ppm or lower (further at a level of 10 ppm or lower), such a content is effective for the improvement of the transmittance at a wavelength of 165 nm or shorter.

Further, it has been found that hydrogen molecules in the non-irradiated synthetic quartz glass have a function to suppress formation of defects by irradiation with ultraviolet rays, and when the hydrogen molecule content is at least $1\times10^{17}$ molecules/cm³, such is effective for the improvement of the transmittance at a wavelength of 165 nm or shorter. Especially when it is at least $1\times10^{18}$ molecules/cm³, such is preferred from the viewpoint of the ultraviolet ray resistance (the nature whereby the transmittance will not remarkably decrease by irradiation with ultraviolet rays) when used as a synthetic quartz glass for an optical member.

Further, in the present invention, the non-irradiated synthetic quartz glass preferably contains substantially no reduction type defects. In the present invention, the reduction type defects mean ≡Si—Si≡ and have an absorption band having a wavelength of 163 nm at the center. The internal transmittance $T_{163}$ (%/cm) at 163 nm is assumed to be represented by the following formula (1) wherein $C_{OH}$ is the OH group content (ppm) in the synthetic quartz glass.

$$T_{163} (\%/cm) \geq \exp(-0.02C_{OH}^{0.85}) \times 100 \qquad (1)$$

In the present invention, "contains substantially no reduction type defects" means that the formula (1) relating to the internal transmittance at 163 nm is satisfied.

However, if reduction type defects are present, there will be an absorption band with 163 nm at the center, whereby the actual transmittance ($T_{163}$) at the wavelength of 163 nm will be smaller than the value on the right side of the formula (1). Therefore, "containing substantially no reduction type defects" is effective to obtain a higher transmittance at a wavelength of 165 nm or shorter.

Further, fluorine may be contained in the non-irradiated synthetic quartz glass. When fluorine is contained in the non-irradiated synthetic quartz glass, fluorine is effective to reduce an instable structure in the non-irradiated synthetic quartz glass and to improve the transmittance at a wavelength of 165 nm or shorter. The fluorine content in the non-irradiated synthetic quartz glass is preferably from 100 to 2000 ppm, more preferably within a range of from 100 to 600 ppm.

Metal impurities such as alkali metals, alkaline earth metals or transition metals, in the non-irradiated synthetic quartz glass not only lower the transmittance at a wavelength ranging from an ultraviolet region to a vacuum ultraviolet region but also cause to lower the ultraviolet ray resistance, and therefore, their content is preferably as small as possible. Specifically, the total amount of metal impurities is preferably at most 100 ppb, particularly preferably at most 50 ppb.

The process for producing the non-irradiated synthetic quartz glass is not particularly limited so long as it is a process whereby the OH group content and the hydrogen molecule content will be within the above-mentioned prescribed ranges. For example, a direct method, a soot method (a VAD method, an OVD method) or a plasma method may be mentioned. A soot method is particularly preferred from such a viewpoint that the temperature during the production is low, and inclusion of impurities such as chlorine and metals, can be avoided.

The wavelength of vacuum ultraviolet light to be irradiated is 180 nm or shorter, preferably 175 nm or shorter. Further, the vacuum ultraviolet light may be continuous light or monochromatic light.

The intensity of the vacuum ultraviolet light to be irradiated is preferably at least 1 mJ/cm². In order to obtain the effect in a shorter period of time, 5 mJ/cm² or higher is preferred. The irradiation time is suitably determined depending upon the light source. The total irradiation energy amount is preferably at least 1000 mJ/cm², particularly preferably at least 3000 mJ/cm².

The atmosphere for irradiation treatment is preferably a nitrogen atmosphere or a He atmosphere, since if oxygen molecules, moisture, etc. are contained in a large amount in the atmosphere, they tend to absorb the vacuum ultraviolet light.

As a specific example of the vacuum ultraviolet light source, a xenon excimer lamp (main wavelength: 172 nm) using xenon as a medium, or $F_2$ laser (main wavelength: 157 nm) using fluorine as a medium, may, for example, be mentioned. In a case where improvement of the transmittance at a wavelength of 165 nm or shorter is required over a wide range, a xenon excimer lamp is preferred. Whereas, from the viewpoint of the productivity, $F_2$ laser is preferred.

The irradiation treatment may be carried out at any stage before or after each step during the process for forming the synthetic quartz glass into an optical member. Here, each step means, for example, a heating step, a cutting step, a polishing step or a finishing step. The irradiation treatment may be carried out after completion as the optical member. Further, the irradiation treatment may be applied only to the light transmitting region (the region corresponding to the light path for transmission of light).

Now, the present invention will be described on the basis of an embodiment of the exposure apparatus of the present invention as shown in FIG. 1. However, FIG. 1 is a schematic view illustrating an example of the exposure apparatus of the present invention, and the structure, the arrangement, etc., by no means restrict the present invention unless otherwise specified. The exposure apparatus shown in the Figure basically comprises an exposure light source system, an illuminating optical system and a projection optical system as the essential constituting elements.

In the exposure light source system, fluorine gas is introduced into a laser chamber 1, and $F_2$ laser is generated by electric discharge by a power source 2. The generated $F_2$ laser usually has a width in the oscillating wavelength, and accordingly, it is subjected to band-narrowing to have a predetermined wavelength half value width by a band-narrowing unit 3 and then emitted to the illuminating optical system via a window material 4. At that time, a part of the laser beam separated from the $F_2$ laser by a half mirror 5 will enter into a beam monitor 6, whereby the wavelength and the output will be monitored.

The illuminating optical system is an optical system comprising condenser lenses 7a and 7b, and a fly eye lens (not shown), etc. The $F_2$ laser from the exposure light source system forms a secondary light source face 8 which is an image of the light source, between the condenser lenses 7a and 7b and further forms parallel beams to uniformly illuminate a reticle 9 held by a reticle alignment system.

On the surface of the outgoing light side of the reticle 9, a reticle pattern is formed with a predetermined magnification depending upon a circuit pattern to be formed on a wafer. The $F_2$ laser passed through the reticle 9 enters into the projection optical system.

The projection optical system is an optical system comprising e.g. a reducing projection lens 10 and an aperture 11, constituted by a combination of a plurality of optical members. In the projection optical system, a Fourier transformation image of the reticle pattern is formed on a pupil plane of the aperture 11. Further, the Fourier transformation imager is formed on a wafer 12 disposed at a predetermined position by a wafer alignment apparatus such as an XY-θ stage at the position of an image surface, whereby a circuit pattern is exposed.

FIG. 1 is one which schematically shows the construction of the exposure apparatus, and each optical system is constituted by a combination of optical members comprising a group of a plurality of lenses, disposed at predetermined positions. For example, the illuminating optical system is constituted by a combination of optical members comprising a plurality of lenses such as fly eye lenses without being limited to condenser lenses (7a and 7b shown in FIG. 1).

Further, the projection optical system is also constituted by a combination of e.g. a group of lenses having positive refractive powers and a group of lenses having negative refractive powers to offset chromatic aberration.

The exposure apparatus of the present invention is one wherein at least one of optical members constituting such an exposure light source system, an illuminating optical system, a reticle and a projection optical system, is made of the above-mentioned synthetic quartz glass for an optical member. Namely, it is one wherein at least one of a band-narrowing unit (etalon), a half mirror and a window material constituting the exposure light source system; various lenses such as condenser lenses constituting the illuminating optical system; and optical members such as a group of lenses having positive refractive powers, a group of lenses having negative refractive powers, etc. constituting the projection optical system, and a reticle, is made of the above synthetic quartz glass for an optical member. In the exposure apparatus of the present invention, all optical members may be made of the above synthetic quartz glass for an optical member, or only a part thereof may be formed by the above synthetic quartz glass for an optical member. As a material for other optical members, fluorite may, for example, be mentioned.

In the exposure apparatus of the present invention, it is particularly preferred to form such optical members as a band-narrowing unit (etalon), a half mirror and a window material in the exposure light source system, a lens disposed at a position where the transmitted laser beam intensity is at most 0.10 $mJ/cm^2$ in the illuminating optical system, and a lens disposed at a position where the transmitted laser beam intensity is at most 0.05 $mJ/cm^2$ in the projection optical system, from the above synthetic quartz glass for an optical member.

Further, if the optical members are constructed by the above synthetic quartz glass for an optical member, the design freedom increases as compared with a case where a crystal material such as fluorite is employed.

Further, it is very advantageous from the viewpoint of the productivity and costs to form a photomask (such as a reticle) from the above synthetics quartz glass for an optical member, since each production step for preparing a reticle will be substantially the same as the production step for a current reticle for an ArF laser or a KrF laser.

The semiconductor device obtainable by means of the exposure apparatus of the present invention will have a fine pattern with a line width of 100 nm or narrower, and will be capable of constituting a DRAM having a memory cell of at least 1 G bits.

Now, the present invention will be described in further detail with reference to Examples. However, the present invention is by no means restricted by these Examples.

PREPARATION EXAMPLE 1

Fine particles of quartz glass formed by heat hydrolysis in an oxyhydrogen flame of $SiCl_4$, were deposited on a substrate by a known soot method, to prepare a porous quartz glass body having a diameter of 35 cm and a length of 100 cm. The obtained porous quartz glass body was set in an electric furnace capable of controlling the atmosphere, and the pressure was reduced to 10 Torr at room temperature and maintained for 1 hour, whereupon a mixed gas of $He/SiF_4 = 99/1$ (volume ratio) was introduced until the pressure became normal pressure. In this atmosphere, fluorine doping was carried out by maintaining the system at normal pressure and room temperature. Then, the temperature was raised to 1450° C. in an atmosphere of 100% He, and the system was maintained at this temperature for 5 hours to obtain a fluorine-containing transparent glass body.

From the obtained transparent quartz glass body, a disc-shaped block of 100φ×30 mm was cut out. The block was maintained for 250 hours in an atmosphere of 100% hydrogen under 10 atm at 500° C. to carry out hydrogen doping treatment to obtain a non-irradiated synthetic quartz glass. The OH group content and the hydrogen molecule content of the obtained synthetic quartz glass were 4.8 ppm and 17.4× $10^{17}$ molecules/$cm^3$, respectively. Further, by the above-mentioned formula (1), presence or absence of reduction type defects was evaluated, whereby it was confirmed that substantially no reduction type defects were contained.

Further, both sides of the disc-shaped synthetic quartz glass were subjected to optical polishing, and then irradiation treatment was applied for 650 hours under a nitrogen atmosphere by a xenon excimer lamp (main wavelength: 172 nm) (total irradiation energy amount: about 13000 J/cm$^2$) to obtain a synthetic quartz glass for an optical member.

At that time, the absorption coefficient for ultraviolet light having a wavelength of 157 nm ("the absorption coefficient for ultraviolet light having a wavelength of 157 nm" will be hereinafter referred to simply as "the absorption coefficient at 157 nm") of the synthetic quartz glass before and after the irradiation treatment, and the position (cm$^{-1}$) of the infrared absorption peak attributable to SiOH stretching vibration ("the infrared absorption peak attributable to SiOH stretching vibration" will be hereinafter referred to simply as the SiOH absorption peak) of the synthetic quartz glass after the irradiation, were measured.

PREPARATION EXAMPLE 2

In the same manner as in Preparation Example 1, a non-irradiated synthetic quartz glass which had an OH group content of 19 ppm and a hydrogen molecule content of 10.3×10$^{17}$ molecules/cm$^3$ and which contained substantially no reduction type defects, was prepared and irradiated with a F$_2$ laser in a nitrogen atmosphere to obtain a synthetic quartz glass for an optical member. The irradiation condition was 10 mJ/cm$^2$×40 Hz×150 min. At that time, the absorption coefficient at a wavelength of 157 nm of the synthetic quartz glass before and after the irradiation treatment, and the position (cm$^{-1}$) of the SiOH absorption peak of the synthetic quartz glass after the irradiation, were measured.

PREPARATION EXAMPLE 3

In the same manner as in Preparation Example 1, a non-irradiated synthetic quartz glass which had an OH group content of 31 ppm and a hydrogen molecule content of 2.1×10$^{17}$ molecules/cm$^3$ and which contained substantially no reduction type defects, was prepared, and irradiation treatment was carried out for 650 hours in a nitrogen atmosphere by an excimer lamp using xenon as a medium (total irradiation energy amount: about 13000 J/cm$^2$) to obtain a synthetic quartz glass for an optical member. At that time, the absorption coefficient at a wavelength of 157 nm of the synthetic quartz glass before and after the irradiation treatment, and the position (cm$^{-1}$) of the SiOH absorption peak of the synthetic quartz glass after the irradiation, were measured.

Evaluation Method

From the center portion of the obtained block of the synthetic quartz glass for an optical member, a sample for evaluation of 30φ×10 mm, was cut out and polished. Then, the hydrogen molecule content, the OH group content, the SiOH absorption peak and the absorption coefficient at 157 nm, were obtained by the following methods.
Hydrogen Molecule Content)

Raman spectrometry was carried out, and the hydrogen molecule content (molecules/cm$^3$) was obtained from the intensity ratio (=I$_{4135}$/I$_{800}$) of the intensity I$_{4135}$ detected from the scattering peak at 4135 cm$^{-1}$ of the laser Raman spectrum to the intensity I$_{800}$ of the scattering peak at 800 cm$^{-1}$ representing the fundamental vibration between silicon and oxygen (V. S. Khotimchenko et a., Zhurnal Prikladnoi Spektroskopii, 46(6), 987–997 (1986)).
OH Group Content and Si—OH Absorption Peak)

If a common synthetic quartz glass contains OH groups, a peak at 3673 cm$^{-1}$ will appear in the transmission spectrum by the infrared spectroscopy. From the absorption of this peak, the substantial peak height (H) is obtained, and further, the thickness (L, unit: cm) of the synthetic quartz glass, through which infrared light passes during the measurement, is obtained, whereupon the OH group content is obtained from the following formula.

OH group content (ppm)=95×H/L

This technique is called β-OH and is commonly used to obtain the OH group content in glass (for example, J. P. Williams et al., Ceram.Bull., 55(5), 524 (1976)).
Absorption Coefficient at 157 nm)

Using a vacuum ultraviolet spectrophotometer, the transmittances at 157 nm of a sample having a thickness of 10 mm and a sample having a thickness of 2 mm were measured, and from these transmittances, the absorption coefficient at 157 nm was calculated. The smaller the value of the absorption coefficient at 157 nm, the higher the transmittance. The results of measurements of spectrum transmittance before and after the vacuum ultraviolet light irradiation treatment in Preparation Example 3, are shown in FIG. 1.

TABLE 1

| Example | OH group content (ppm) | Hydrogen molecule content (×10$^{17}$ molecules/cm$^3$) | Absorption coefficient at a wavelength of 157 nm | | SiOH absorption peak |
|---|---|---|---|---|---|
| | | | Before irradiation | After irradiation | |
| 1 | 4.8 | 17.4 | 0.223 | 0.196 | 3642 |
| 2 | 19 | 10.3 | 0.565 | 0.293 | 3641 |
| 3 | 31 | 2.1 | 0.787 | 0.574 | 3643 |

WORKING EXAMPLE

Using synthetic quartz glasses obtained in Preparation Examples 1 to 3, reticles (6 inch square×¼ inch thickness) were prepared. Then, the reticle having an exposed pattern formed, was incorporated into the exposure apparatus, a schematic construction of which is shown in FIG. 1. Using this exposure apparatus and using a F$_2$ laser beam with a power of 5 W as the exposure light source, the exposure pattern formed on the reticle was reduced and projected on a wafer held on a wafer alignment and having a resist coated in a thickness of 0.5 μm on the surface, and exposure was carried out. At that time, the energy density of the laser beam at the reticle was 0.01 mJ/cm$^2$. Further, the energy density on the wafer surface was 0.15 mJ/cm$^2$.

The obtained exposed wafer was developed by a known method, and with respect to the formed circuit pattern, the line width and reproducibility of the line width were evaluated, whereby the line width was not more than 100 nm, and reproducibility of the line width was good.

INDUSTRIAL APPLICABILITY

The exposure apparatus of the present invention is capable of producing a semiconductor device comprising an integrated circuit having a fine pattern with a line width of not more than 100 nm, by using a F$_2$ laser beam as an exposure light source.

The semiconductor device of the present invention is capable of constituting DRAM, etc. having a fine pattern with a line width of not more than 100 nm, such as a memory cell of at least 1 G bits.

The photomask of the present invention is useful for forming a fine pattern with a line width of not more than 100 nm on a wafer, as used in an exposure apparatus using $F_2$ laser as a light source.

What is claimed is:

1. An exposure apparatus employing a fluorine laser as a light source, wherein at least one of optical members constituting an exposure light source system, an illuminating optical system, a photomask and a projection optical system, is made of a synthetic quartz glass for an optical member, and said synthetic quartz glass for an optical member has a absorption coefficient of 0.70 cm$^{-1}$ or less at a wavelength of 157 nm; wherein the synthetic quartz glass for an optical member has an infrared absorption peak attributable to SiOH stretching vibration at about 3640 cm$^{-1}$.

2. A semiconductor device obtained by employing the exposure apparatus as defined in claim 1.

3. A semiconductor device obtained by employing the exposure apparatus as defined in claim 1.

4. A photomask employing a synthetic quartz glass for an optical member, which has an absorption coefficient of 0.70 cm$^{-1}$ or less at a wavelength of 157 nm and an infrared absorption peak attributable to SiOH stretching vibration at about 3640 cm$^{-1}$.

* * * * *

UNITED STATES PATENT AND TRADEMARK OFFICE
CERTIFICATE OF CORRECTION

PATENT NO. : 6,611,317 B1
DATED : August 26, 2003
INVENTOR(S) : Ogawa et al.

It is certified that error appears in the above-identified patent and that said Letters Patent is hereby corrected as shown below:

<u>Title page,</u>
Item [73], should read:

-- [73] Assignees: Asahi Glass Company, Limited, Tokyo (JP); Semiconductor Leading Edge Technologies, Inc., Yokohama (JP) --

Signed and Sealed this

Sixteenth Day of December, 2003

JAMES E. ROGAN
*Director of the United States Patent and Trademark Office*